(12) United States Patent
Lee

(10) Patent No.: US 8,203,366 B2
(45) Date of Patent: Jun. 19, 2012

(54) SWITCH DRIVING CIRCUIT AND SWITCH DRIVING METHOD

(75) Inventor: Youngsik Lee, Seoul (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 0 days.

(21) Appl. No.: 12/615,839

(22) Filed: Nov. 10, 2009

(65) Prior Publication Data

US 2010/0123485 A1 May 20, 2010

(30) Foreign Application Priority Data

Nov. 19, 2008 (KR) .................. 10-2008-0115320

(51) Int. Cl.
*H03K 3/00* (2006.01)

(52) U.S. Cl. .................... 327/108; 327/112; 326/83

(58) Field of Classification Search .............. 327/108, 327/112; 326/82, 83
See application file for complete search history.

(56) References Cited

U.S. PATENT DOCUMENTS

| | | | | |
|---|---|---|---|---|
| 5,383,083 | A | * 1/1995 | Shinoda et al. | ............ 361/103 |
| 5,929,665 | A | * 7/1999 | Ichikawa et al. | ............ 327/109 |
| 6,819,149 | B2 | 11/2004 | Shirasawa et al. | |
| 7,463,079 | B2 | * 12/2008 | De et al. | ............ 327/379 |
| 2004/0027762 | A1 | * 2/2004 | Ohi et al. | ............ 361/100 |
| 2006/0279351 | A1 | 12/2006 | Salato et al. | |

\* cited by examiner

*Primary Examiner* — Kenneth B. Wells
(74) *Attorney, Agent, or Firm* — Okamoto & Benedicto LLP

(57) ABSTRACT

Disclosed is a switch driving circuit for controlling the switching operation of a switch. The switch driving circuit includes a driver generating a normal gate signal for controlling the switching operation of the switch, and a gate signal correction circuit comparing the normal gate signal with a gate signal applied to a gate electrode of the switch so as to correct the gate signal in accordance with the comparison.

15 Claims, 5 Drawing Sheets

SWITCH DRIVING CIRCUIT AND SWITCH DRIVING METHOD

CROSS-REFERENCE TO RELATED APPLICATION

This application claims priority to and the benefit of Korean Patent Application No. 10-2008-0115320 filed in the Korean Intellectual Property Office on Nov. 19, 2008, the entire contents of which are incorporated herein by reference.

BACKGROUND OF THE INVENTION (a) Field of the Invention

The present invention relates to a driving circuit that is capable of supplying gate signals in a stable manner.

(b) Description of the Related Art

When a gate signal is oscillated in voltage with a conventional gate driver, there is no way of reducing such an oscillation. The gate signal is oscillated in voltage due to parasitic inductance of a switch. The parasitic inductance is easily generated by a bonding wire interconnecting the switch and the driver, or a wire pattern formed on a printed circuit board. When the voltage waveform of the gate signal is oscillated due to the parasitic inductance, the switching operation of the switch becomes unstable, and much noise occurs during the switching operation. If the voltage oscillation of the gate signal is large in width, the switch is liable to turn off, or to be broken.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a switch driving circuit and a switch driving method having advantages of supplying gate signals in a stable manner.

An exemplary embodiment of the present invention provides a switch driving circuit for controlling the switching operation of a switch. The switch driving circuit includes a driver generating a normal gate signal for controlling the switching operation of the switch, and a gate signal correction circuit comparing the normal gate signal with a gate signal applied to a gate electrode of the switch to correct the gate signal depending upon the comparison. The gate signal correction circuit generates a correction current depending upon the result of comparing the normal gate signal with the gate signal, and the correction current flows in a direction for correcting the gate signal such that the gate signal equals the normal gate signal. The gate signal correction circuit includes a comparator receiving the normal gate signal and the gate signal to generate a correction control signal in accordance with the difference between the normal gate signal and the gate signal, and a correction switch conducted in accordance with the correction control signal such that the correction current flows along the correction switch. The switch is formed with an n-channel typed transistor, and if the gate signal is less than the normal gate signal, the gate signal correction circuit makes a correction current flow to the gate electrode of the switch such that the gate signal equals the normal gate signal. The gate signal correction circuit includes a comparator having an inverting terminal receiving the normal gate signal and a non-inverting terminal receiving the gate signal, and a correction switch generating the correction current in correspondence with the correction control signal. If the gate signal is less than the normal gate signal, the comparator generates a correction control signal that is proportional to the difference between the gate signal and the normal gate signal. The switch is formed with an n-channel typed transistor, and if the gate signal exceeds the normal gate signal, the gate signal correction circuit makes a correction current flow from the gate electrode of the switch such that the gate signal equals the normal gate signal. The gate signal correction circuit includes a comparator having an inverting terminal receiving the normal gate signal and a non-inverting terminal receiving the gate signal, and a correction switch generating the correction current in correspondence with the correction control signal. If the gate signal exceeds the normal gate signal, the comparator generates a correction control signal that is proportional to the difference between the gate signal and the normal gate signal.

Another exemplary embodiment of the present invention provides a switch driving method for controlling the switching operation of a switch. The switch driving method includes generating a normal gate signal to control the switching operation of the switch, and comparing the normal gate signal with a gate signal applied to a gate electrode of the switch to correct the gate signal depending upon the comparison. The step of correcting the gate signal includes comparing the normal gate signal with the gate signal, and generating a correction current in accordance with the comparison to make the gate signal equal the normal gate signal. The step of comparing the normal gate signal with the gate signal includes producing the difference between the normal gate signal and the gate signal, and the step of generating the correction current includes generating a correction control signal in accordance with the produced difference and controlling the conduction degree of the correction switch in accordance with the correction control signal.

With the switch driving circuit and the switch driving method, the gate signals are supplied in a stable and reliable manner.

DETAILED DESCRIPTION OF THE EMBODIMENTS

Figure 1:
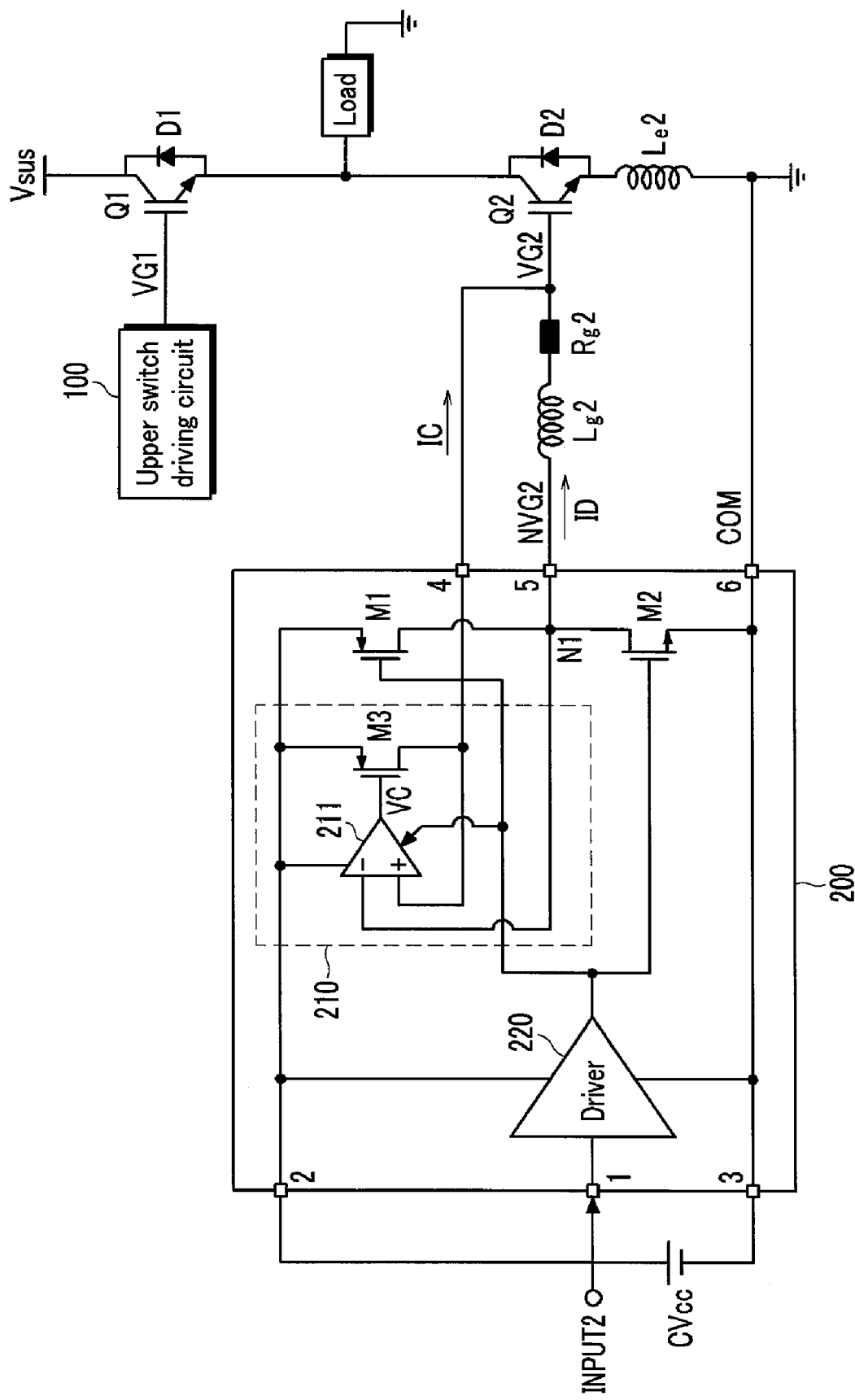
FIG. 1 illustrates a lower switch driving circuit according to a first exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "connected" to another element, the element may be "directly connected" to the other element or "electrically connected" to the other element through a third element. In addition, unless explicitly described to the contrary, the word "comprise" and variations such as "comprises" or "comprising" will be understood to imply the inclusion of stated elements but not the exclusion of any other elements.

A driving circuit according to an exemplary embodiment of the present invention will now be described in detail with reference to the accompanying drawings.

FIG. 1 illustrates a lower switch driving circuit for controlling the switching operation of a lower switch by using a driving circuit according to an exemplary embodiment of the present invention.

An upper switch Q1 and a lower switch Q2 are each formed with a metal oxide semiconductor field effect transistor (MOSFET), a bipolar junction transistor (BJT), or an insulated gate bipolar transistor (IGBT). The upper and lower switches Q1 and Q2 have body diodes D1 and D2, respectively. The upper and lower switches Q1 and Q2 according to an exemplary embodiment of the present invention are each formed with an n-channel MOSFET, BJT, or IGBT. Accordingly, if first and second gate control signals VG1 and VG2 are in a high level, the switches Q1 and Q2 turn on, whereas if the first and second gate control signals VG1 and VG2 are in a low level, the switches Q1 and Q2 turn off. The contact point at which the source electrode of the upper switch Q1 and the drain electrode of the lower switch Q2 meet each other becomes an output terminal, and a load is connected between the output terminal and the ground. A driving circuit according to an exemplary embodiment of the present invention controls the switching operation of the upper and lower switches Q1 and Q2. The upper and lower switches Q1 and Q2 may be formed with various switching elements. The control electrode, which receives a control signal for controlling the switching operation of the switching element, will be referred to hereinafter as a gate electrode. Furthermore, the control signal applied to the control electrode will be referred to as a gate signal. The gate signal output from the switch driving circuit will be referred to as a normal gate signal, and the signal applied to the gate of the practical switch as a gate signal.

An upper switch driving circuit 100 shown in FIG. 1 may have the same structure as that of a lower switch driving circuit 200. However, the present invention is not limited thereto.

As shown in FIG. 1, the lower switch driving circuit 200 includes a gate signal correction circuit 210, a driver 220, an on driving switch M1, and an off driving switch M2. The lower switch driving circuit 200 is connected to a capacitor CVcc via connection terminals 2 and 3. The capacitor CVcc supplies a power voltage Vcc to the lower switch driving circuit 200 to operate it. A parasitic inductor Lg2 shown in FIG. 1 is generated by a bonding wire interconnecting the lower switch driving circuit 200 and the gate electrode of the lower switch Q2, or a pattern of a printed circuit board. The parasitic inductor Lg2 indicates a causal factor generated between the normal lower gate signal output from the lower switch driving circuit 200 and the lower gate signal transmitted to the gate electrode of the practical lower switch. The parasitic inductor Lg2 may further include a parasitic capacitor. Another parasitic inductor Le2 indicates the parasitic inductance existent at the wire interconnecting the source electrode of the lower switch Q2 and the ground. The lower switch driving circuit 200 controls the switching operation of the lower switch Q2 in accordance with an input signal INPUT2.

The input signal INPUT2 is input into the input terminal of the driver 220 via a connection terminal 1. The driver 220 is connected to both ends of the capacitor CVcc to receive a power voltage Vcc therefrom. If the input signal INPUT2 is in a high level, the driver 220 transmits a low level gate control signal VGC to the on driving switch M1 and the off driving switch M2. On the contrary, if the input signal INPUT2 is in a low level, the driver 220 transmits a high level gate control signal VGC to the on driving switch M1 and the off driving switch M2. The on driving switch M1 and the off driving switch M2 are formed with a P-type channel transistor and an N-type channel transistor, respectively. The source electrode of the on driving switch M1 is connected to an end of the capacitor CVcc so as to receive the power voltage Vcc therefrom. The drain electrode of the on driving switch M1 and the drain electrode of the off driving switch M2 are connected to a node N1. The node N1 is connected to the gate electrode of the lower switch Q2 via a connection terminal 5, and the driving current ID flows to the gate electrode through the connection terminal 5. The source electrode of the off driving switch M2 is connected to the opposite end of the capacitor CVcc, and is grounded. When the on driving switch M1 turns on, the voltage of the node N1 becomes the power voltage Vcc, while when the off driving switch M2 turns on, the voltage of the node N1 becomes the ground voltage.

The gate signal correction circuit 210 includes a comparator 211 and a correction switch M3. The gate signal correction circuit 210 compares the normal lower gate signal NVG2 with the lower gate signal VG2 in terms of voltage, and if the lower gate signal VG2 is less than the normal lower gate signal NVG2, corrects the lower gate signal VG2. The comparator 211 is enabled by way of the signal for turning on the on driving switch M1. The comparator 211 has an inverting terminal (−) receiving the normal lower gate signal NVG2, and a non-inverting terminal (+) connected to the gate electrode of the lower switch Q2 via a connection terminal 4 to receive the lower gate signal VG2. If the normal lower gate signal NVG2 exceeds the gate signal VG2, the comparator 211 outputs a low level correction control signal VC that is proportional to the difference between the two signals so as to turn on the correction switch M3. The conduction degree of the correction switch M3 is controlled by the difference between the two signals, and the dimension of the correction current IC transmitted to the gate electrode of the lower switch Q2 is controlled through the correction switch M3. When the lower gate signal VG2 is elevated by the correction current IC and reaches the normal lower gate signal NVG2, the comparator 211 outputs a high level signal so as to turn off the correction switch M3. Then, the lower gate signal VG2 of the lower switch Q2 is not less in voltage than the normal lower gate signal NVG2. Accordingly, the lower switch Q2 can turn on in a normal manner.

Figure 2:
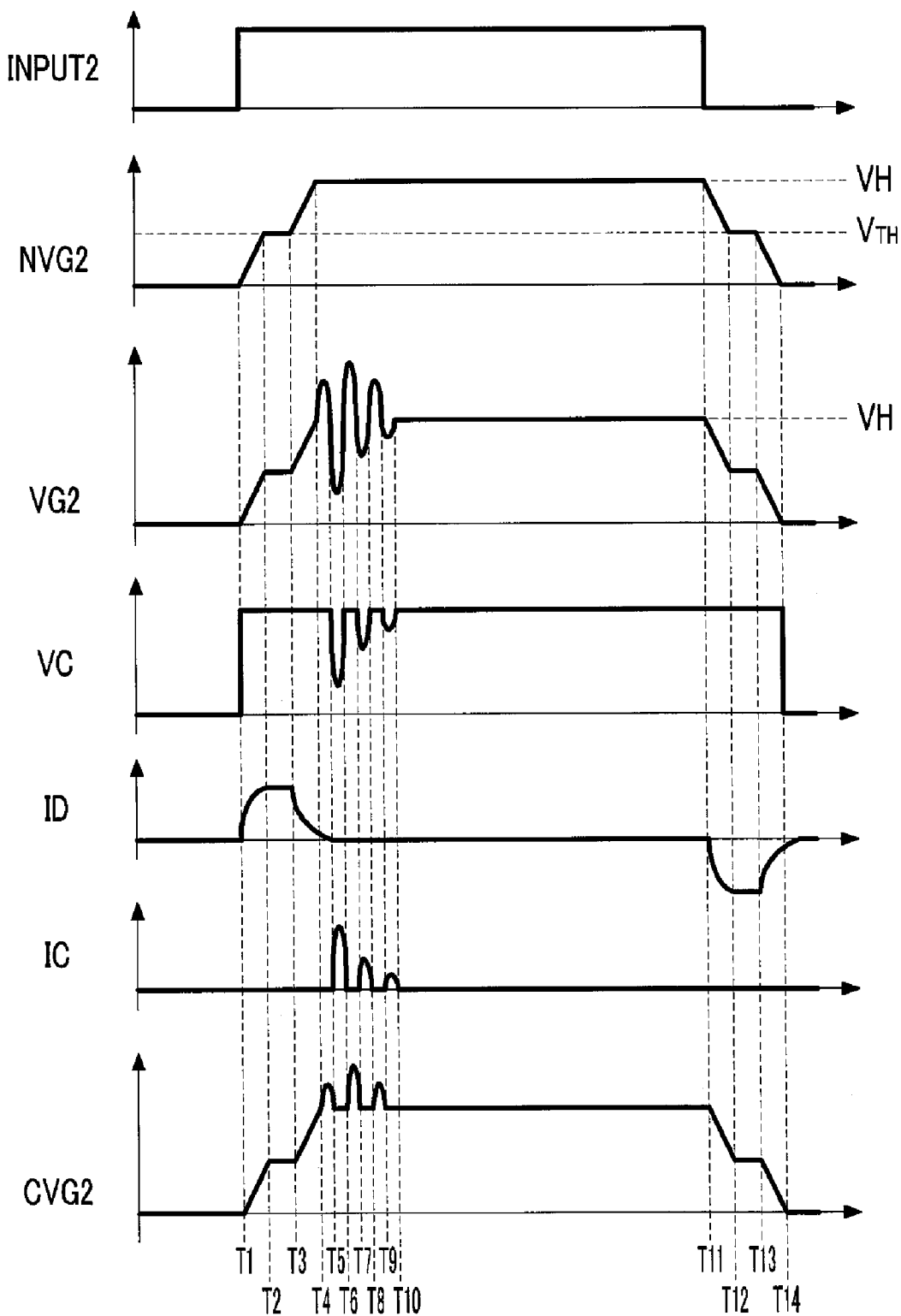
FIG. 2 illustrates signal waveforms of a lower switch driving circuit according to a first exemplary embodiment of the present invention.

FIG. 2 illustrates the waveforms of signals of a lower switch driving circuit according to a first exemplary embodiment of the present invention.

When the input signal INPUT2 is elevated at the time point of T1, the driver 220 outputs a low level gate control signal VGC1 to turn on the on driving switch M1. Then, the comparator 211 is enabled, and the conduction degree of the on driving switch M1 is gradually increased so that the normal lower gate signal NVGS2 increases after the time point of T1 by a predetermined slope. The lower gate signal VG2 also increases after the time point of T1 by a predetermined slope. Then, the driving current ID flowing along the gate electrode of the lower switch Q2 increases gradually. As the driving current ID charges a gate-source capacitor (not shown)

formed between the gate and the source electrodes of the lower switch Q2, the increasing degree thereof is reduced gradually.

When the normal lower gate signal NVG2 and the lower gate signal VG2 reach the threshold voltage of the lower switch Q2 at the time point of T2, the gate-source capacitor is charged by the predetermined driving current ID during the period of T2 to T3. When the normal lower gate signal NVG2 and the lower gate signal VG2 hold the threshold voltage, the driving current ID is kept constant. The lower switch Q2 turns on after the time point of T3, and then the driving current ID slowly decreases while the normal lower gate signal NVG2 and the lower gate signal VG2 increase by a predetermined slope. When the normal lower gate signal NVG2 and the lower gate signal VG2 reach the voltage of VH at the time point of T4, they are kept constant with no increase. The VH voltage substantially approximates the power voltage Vcc.

As shown in FIG. 2, the corrected lower gate signal CVG2 indicates the signal corrected by the correction current IC supplied from the gate signal correction circuit 210 when the lower gate signal VG2 is oscillated.

For example, when the lower gate signal VG2 begins to oscillate from the time point of T4 and the lower gate signal VG2 is less than the normal lower gate signal NVG2, the correction control signal VC becomes a low voltage in accordance with the difference between the two signals. If the lower gate signal is less than the normal lower gate signal NVG2 during the period of T5 to T6, the correction control signal VC becomes low-level by the difference between the two signals. Then, the correction current IC is supplied to the gate electrode of the lower switch Q2 in accordance with the correction control signal VC. The corrected lower gate signal CVG2 is then maintained to hold the VH voltage. As the lower gate signal VG2 is also less than the normal lower gate signal NVG2 during the period of T7 to T8 and the period of T9 to T10, the correction control signal VC is lowered by the difference between the two signals so that a correction current IC is generated.

When the input signal INPUT2 descends at the time point of T11, the driver 220 transmits a high level gate control signal VGC to the on driving switch M1 and the off driving switch M2. Then, the off driving switch M2 turns on so that a driving current ID flowing from the gate-source capacitor to the ground is generated. The normal lower gate signal NVG2 and the lower gate signal VG2 begin to be reduced.

The driving current ID radically increases during the period of T11 to T12 in the negative direction, and the normal lower gate signal NVG2 and the lower gate signal VG2 decrease at a predetermined slope, by way of the driving current ID. The driving current ID is kept constant during the period of T12 to T13, and the normal lower gate signal NVG2 and the lower gate signal VG2 hold the threshold voltage of the lower switch Q2. After the time point of T13, the lower switch Q2 turns off and the driving current ID decreases in amount so that the normal lower gate signal NVG2 and the lower gate signal VG2 are reduced by a predetermined slope. And the normal lower gate signal NVG2 and the lower gate signal VG2 become the ground voltage at the time point of T14.

As described above, with the first exemplary embodiment of the present invention, if the lower gate signal decreases through oscillation, a correction current is generated so as to correct the lower gate signal. Then, the lower switch is prevented from being mis-operated due to the oscillation of the lower gate signal.

Figure 3:
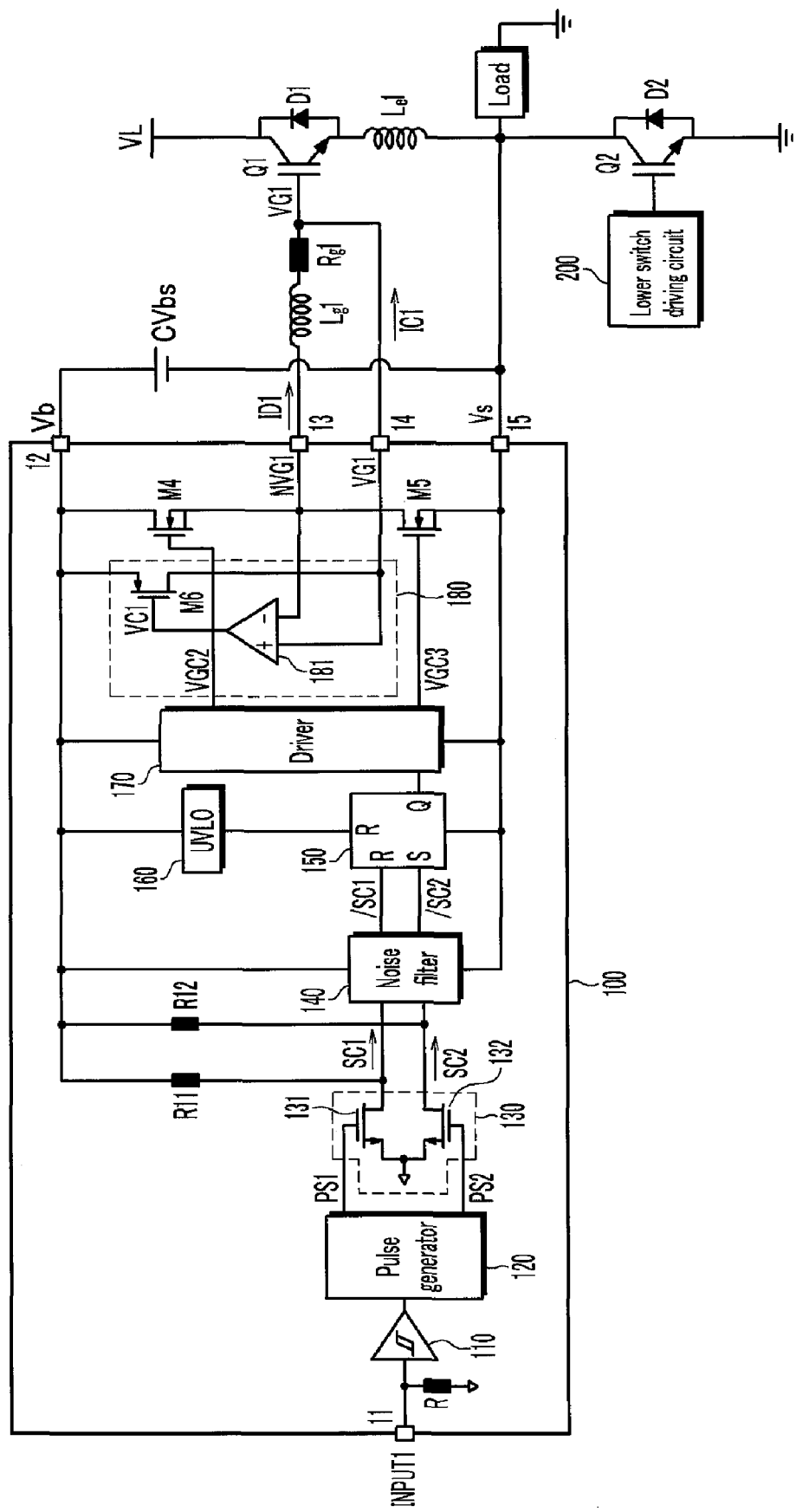
FIG. 3 illustrates an upper switch driving circuit according to a second exemplary embodiment of the present invention.

An upper switch driving circuit 100 according to a second exemplary embodiment of the present invention will now be described in detail. FIG. 3 illustrates the structure of an upper switch driving circuit 100 according to a second exemplary embodiment of the present invention. The lower switch driving circuit 200 according to the second exemplary embodiment of the present invention may have the same structure and operations as those related to the first exemplary embodiment of the present invention.

The upper switch driving circuit 100 includes a Schmidt trigger 110, a pulse generator 120, a level shifter 130, a noise filter 140, a flip-flop 150, an under-voltage lock out (UVLO) 160, a driver 170, a gate signal correction circuit 180, an on driving switch M4, and an off driving switch M5. The upper switch driving circuit 100 controls the switching operation of the upper switch Q1 in accordance with the input signal INPUT1 input through a connection terminal 11. When the input signal INPUT1 is in a high level, the upper switch driving circuit 100 turns on the upper switch Q1, while when the input signal INPUT1 is in a low level, the upper switch driving circuit 100 turns off the upper switch Q1. As with the first exemplary embodiment of the present invention, a parasitic inductor Lg1 is formed between the upper switch driving circuit 100 and the upper switch Q1, and another parasitic inductor Le1 is connected to the wire interconnecting the upper switch Q1 and the load. The upper switch driving circuit 100 is connected to both ends of a capacitor CVbs via connection terminals 12 and 15, and the capacitor CVbs supplies power to the upper switch driving circuit 100 to operate it. The one-side voltage Vb of the capacitor CVbs is in a high level, while the opposite-side voltage Vs thereof is in a low level. A resistor R is connected to the input terminal of the Schmidt trigger 110. If the input signal INPUT1 is absent or the input signal line is floating or open, the resistor R has a role of keeping the input signal INPUT1 to be in a low level, thereby preventing the gate driving circuit 100 from being mis-operated.

When the input signal exceeds a predetermined high level reference voltage, the Schmidt trigger 110 outputs a high level signal, while when the input signal is less than a predetermined low level reference voltage, the Schmidt Trigger 110 outputs a low level signal. Furthermore, the Schmidt trigger 110 maintains the present output without change when the input signal ranges between the high level reference voltage and the low level reference voltage. The input signal INPUT1 has a high level and a low level. The high level of the input signal INPUT1 exceeds the high level reference voltage of the Schmidt trigger 110, and the low level of the input signal INPUT1 is less than the low level reference voltage of the Schmidt trigger 110.

The pulse generator 120 generates predetermined short pulse signals PS1 and PS2 at the time point when the output signal of the Schmidt trigger 110 descends from the high level to the low level, and at the time point when the output signal of the Schmidt trigger 110 ascends from the low level to the high level. The pulse signal PS1 becomes a predetermined short pulse at the time point when the output signal of the Schmidt trigger 110 ascends, and the pulse signal PS2 becomes a predetermined short pulse at the time point when the output signal of the Schmidt trigger 110 descends.

The level shifter 130 includes switches 131 and 132 that turn on or off in accordance with the predetermined short pulse signals PS1 and PS2, respectively. The level shifter 130 transmits switching control signals SC1 and CS2 to the reset terminal R and the set terminal S of the flip-flop 150 through a noise filter 140 depending upon the turning on or off of the switches 131 and 132. When the switch 131 turns on, the switching control signal SC1 becomes the ground voltage, while when the switch 131 turns off, the switching control signal SC1 becomes a voltage where the Vb voltage is distributed in accordance with the turning off resistance ratio of a resistor R11 and the switch 131. The distributed voltage is in a predetermined high level. The switching control signal SC1 is transmitted to the reset terminal R of the flip-flop 150 through the noise filter 140. When the switch 132 turns on, the switching control signal SC2 becomes the ground voltage, while when the switch 132 turns off, the switching control signal SC2 becomes a voltage where the Vb voltage is distributed in accordance with the turning off resistance ratio of a resistor R12 and the switch 132. The distributed voltage is in a predetermined high level. The switching control signal SC2 is transmitted to the set terminal S of the flip-flop 150 through the noise filter 140.

The noise filter 140 has a role of stably transmitting the output signal of the level shifter 130 to the flip-flip 150 as the potential of the connection terminal 15 is varied depending upon the switch operation of the upper and lower switches Q1 and Q2. The noise filter 140 according to an exemplary embodiment of the present invention inverts its level and outputs the inverted value during the operation of removing the noise of the input switching control signals SC1 and SC2. The switching control signals SC1 and SC2 inverted and output from the noise filter 140 will be referred to hereinafter as the inverted switching control signals /SC1 and /SC2.

The output signal of the UVLO 160 and the inverted switching control signal /SC1 are input into the reset terminal R of the flip-flop 150, and the inverted switching control signal /SC2 is input into the set terminal S thereof. The flip-flop 150 outputs a high level signal through the output terminal Q if the signal input into the set terminal S is in a high level and the signal input into the reset terminal R is in a low level, while the flip-flop 150 outputs a low level signal through the output terminal Q if a low level signal is input into the set terminal R and a high level signal is input into the reset terminal R. The flip-flop 150 holds the present output when a low level signal is input into the set terminal S and the reset terminal R.

When the input signal INPUT1 is in a high level, the Schmidt trigger 110 outputs a high level signal, and the pulse generator 120 is synchronized at the time point when the output of the Schmidt trigger 110 ascends from the low level to a high level so as to generate a pulse signal PS2 with a predetermined short high level pulse. The switch 132 is controlled by the pulse signal PS2. The switch 132 turns on by way of the high level pulse of the pulse signal PS2 so that the switching control signal SC2 of the ground voltage is inverted by way of the noise filter 140 so as to generate an inverted high level switching control signal /SC2. At this time, as the switch 131 is in the turned-off state, the switching control signal SC1 is in a high level, and an inverted low level switching control signal /SC1 is generated through the noise filter 140. Then, the flip-flop 150 outputs a high level signal, and the output signal of the flip-flop 150 is input into the driver 170. When the input signal INPUT1 is in a low level, the Schmidt trigger 110 outputs a low level signal, and the pulse generator 120 is synchronized at the time point when the output of the Schmidt trigger 110 descends from the high level to a low level so as to generate a pulse signal PS1 with a predetermined short high level pulse. The switch 131 is controlled by the pulse signal PS1. The switch 131 turns on by way of the high level pulse of the pulse signal PS1 so that the switching control signal SC1 of the ground voltage is inverted through the noise filter 140 so as to generate an inverted high level switching control signal /SC1. As the switch 132 is in the turned-off state, the switching control signal SC2 is in a high level, and an inverted low level switching control signal /SC2 is generated through the noise filter 140. Then, the flip-flop 150 outputs a low level signal, which is input into the driver 170.

The driver 170 controls the switching operation of the on driving switch M4 and the off driving switch M5 in accordance with the output signal of the flip-flop 150. The on driving switch M4 and the off driving switch M5, which are n-channel typed transistors, turn on when a high level signal is applied to the gate electrode. When the output signal of the flip-flop 150 is in a high level, the driver 170 generates a high level gate control signal VGC2 so as to transmit it to the gate electrode of the on driving switch M4, and a low level gate control signal VGC3 so as to transmit it to the off driving switch M5. When the output signal of the flip-flop 150 is in a low level, the driver 170 generates a low level gate control signal VGC2 so as to transmit it to the gate electrode of the on driving switch M4, and a high level gate control signal VGC3 so as to transmit it to the gate electrode of the off driving switch M5. In this way, when the output signal of the flip-flop 150 is in a high level, the on driving switch M4 turns on so that the normal upper gate signal NVG1 becomes a high level by way of the Vb voltage, and the driving current ID1 flows to the gate electrode of the upper switch Q1 via a connection terminal 13. When the output signal of the flip-flop 150 is in a low level, the off driving switch M5 turns on so that the normal upper gate signal NVG1 becomes a low level by way of the Vs voltage, and the driving current ID1 flows to the load through the connection terminal 13 via the off driving switch M5 and a connection terminal 15.

When the power voltage Vb is less than a predetermined first threshold voltage, the UVLO 160 outputs a high level signal, while when the power voltage Vb exceeds a predetermined second threshold voltage, the UVLO 160 outputs a low level signal. The output signal of the UVLO 160 is input into the reset terminal R of the flip-flop 150. Accordingly, when the power voltage Vb is less than the first threshold voltage, the switching operation of the upper switch Q1 is stopped, while when the power voltage Vb again exceeds the second threshold voltage, the switching of the upper switch Q1 begins to be operated again.

The gate signal correction circuit 180 includes a comparator 181 and a correction switch M6. The gate signal correction circuit 180 compares the normal upper gate signal NVG1 with the upper gate signal VG1 in terms of voltage, and if the upper gate signal VG1 is less than the normal upper gate signal NVG1, corrects the upper gate signal VG1. The comparator 181 is enabled by way of the signal of the driver 170 for turning on the on driving switch M4. The inverting terminal (−) of the comparator 181 receives the normal upper gate signal NVG1, and the non-inverting terminal (+) of the comparator 181 is connected to the gate electrode of the upper switch Q1 via the connection terminal 14 so as to receive the upper gate signal VG1. When the normal upper gate signal NVG1 exceeds the upper gate signal VG1, the comparator 181 outputs a low level correction control signal VC1 that is proportional to the difference between the two signals so as to turn on the correction switch M6. The conduction degree of the correction switch M6 is controlled by the difference between the two signals, and the dimension of the correction current IC1 transmitted to the gate electrode of the upper switch Q1 is controlled through the correction switch M6. When the upper gate signal VG1 that is elevated by way of the correction current IC1 reaches the normal upper gate signal NVG1, the comparator 181 outputs a high level signal so as to turn off the correction switch M6. Then, the upper gate signal VG1 of the upper switch Q1 is not less in voltage than the normal upper gate signal NVG1. Accordingly, the upper switch Q1 can turn on in a normal manner.

A switch driving circuit where an upper switch driving circuit and a lower switch driving circuit are integrated according to a third exemplary embodiment of the present invention will now be described with reference to FIG. 4.

Figure 4:
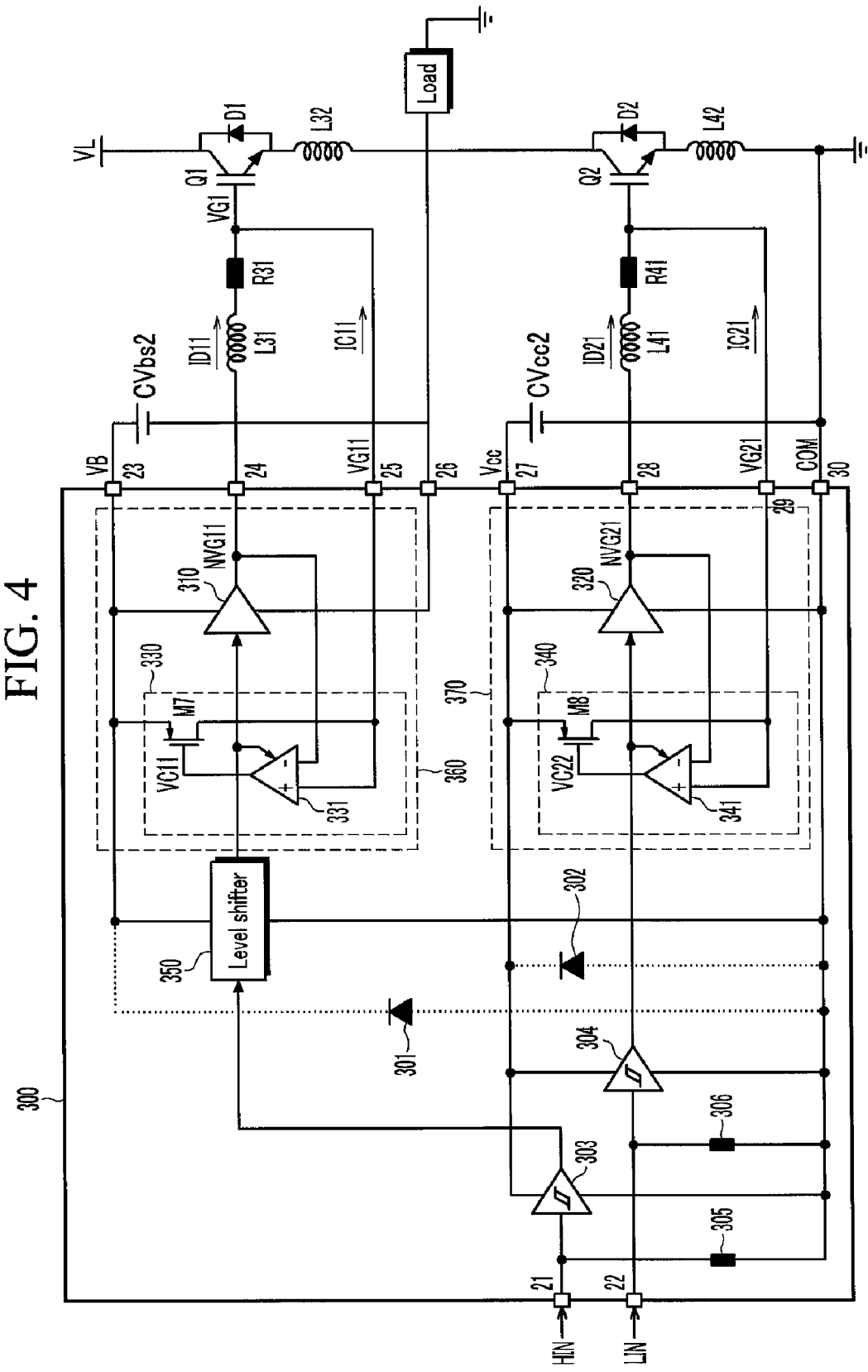
FIG. 4 illustrates a switch driving circuit according to a third exemplary embodiment of the present invention.

FIG. 4 illustrates a switch driving circuit 300 according to a third exemplary embodiment of the present invention, the operational principle and structures of which are similar to those related to the first and second exemplary embodiments of the present invention. A parasitic inductor L31 is formed between the switch driving circuit 300 and the upper switch Q1, and a parasitic inductor L32 is connected to the wire interconnecting the upper switch Q1 and the load. A parasitic inductor L41 is formed between the switch driving circuit 300 and the lower switch Q2, and a parasitic inductor L42 is connected to the wire interconnecting the lower switch Q2 and the ground.

The switch driving circuit 300 generates normal upper and normal lower gate signals NVG1 and NVG2 in accordance with upper and lower switch driver control signals HIN and LIN, respectively. The switch driving circuit 300 includes Schmidt triggers 303 and 304, a level shifter 350, parasitic diodes 301 and 302, resistors 305 and 306, and upper and lower switch driving circuits 360 and 370. One of the parasitic diodes 301 is formed between connection terminals 23 and 30, and the other parasitic diode 302 is formed between the connection terminal 30 and another connection terminal 27. It is preferable in order to normally operate the switch driving circuit 300 for the parasitic diodes 301 and 302 to not be biased in the forward direction. As the common voltage COM applied through the connection terminal 30 is usually the ground voltage, the parasitic diodes 301 and 302 are not biased in the forward direction.

The Schmidt trigger 303 outputs a high level signal or a low level signal depending upon the upper switch driver control signal HIN. The Schmidt trigger 303 outputs a low level signal when the upper switch driver control signal HIN is less than a predetermined voltage that is higher than the common voltage COM (referred to hereinafter as the "low threshold voltage"), while outputting a high level signal when the upper switch driver control signal HIN exceeds a predetermined voltage that is less than the Vcc voltage (referred to hereinafter as the "high threshold voltage"). The operation range of the Schmidt trigger 303 is determined by the common voltage COM and the Vcc voltage, and the operation range of the upper switch driving circuit 360 is determined by voltages VB and VS applied thereto through the connection terminals 23 and 26. As a result, the output signal of the Schmidt trigger 303 may deviate from the operation range of the upper switch driving circuit 360. The operation range means the voltage range of the output signal that is determined in accordance with the input signal. In order to prevent such a deviation, the level shifter 350 shifts the output signal of the Schmidt trigger 303 by a suitable degree, and outputs the shifted signal to the upper switch driving circuit 360.

The upper switch driving circuit 360 generates a normal upper gate signal NVG11 and an upper gate signal VG11 in accordance with the upper switch driver control signal HIN. The upper switch driving circuit 360 includes an upper driver 310 and a gate signal correction circuit 330. The output signal of the level shifter 350 is input into the upper driver 310, and the upper driver 310 generates and outputs a normal upper gate signal NVG11 in accordance with the input signal. The upper driver 310 compares the normal upper gate signal NVG11 with the upper gate signal VG11 so as to control the upper gate signal VG11 to be not less than the normal upper gate signal NVG11.

The gate signal correction circuit 330 compares the normal upper gate signal NVG11 with the upper gate signal VG11 in terms of voltage, and if the upper gate signal VG11 is less than the normal upper gate signal NVG11, corrects the upper gate signal VG11. The gate signal correction circuit 330 includes a comparator 331 and a correction switch M7. The comparator 331 is enabled when the output signal of the level shifter 350 has a signal level that is high enough to turn on the upper switch. The inverting terminal (−) of the comparator 331 receives the normal upper gate signal NVG11, and the non-inverting terminal (+) is connected to the gate electrode of the upper switch Q1 via a connection terminal 25 so as to receive the upper gate signal VG11. When the normal upper gate signal NVG11 exceeds the upper gate signal VG11, the comparator 331 outputs a low level correction control signal VC11 that is proportional to the difference between the two signals so as to turn on the correction switch M7. The conduction degree of the correction switch M7 is controlled by the difference between the two signals, and the dimension of the correction current IC11 transmitted to the gate electrode of the upper switch Q1 is controlled through the correction switch M7. When the upper gate signal VG11 that is elevated by way of the correction current IC11 reaches the normal upper gate signal NVG11, the comparator 331 outputs a high level signal so as to turn off the correction switch M7. Then, the upper gate signal VG11 of the upper switch Q1 is not less in voltage than the normal upper gate signal NVG11. Accordingly, the upper switch Q1 can turn on in a normal manner.

Specifically, if the upper switch driver control signal HIN exceeds the high threshold voltage, the Schmidt trigger 303 outputs a high level signal, and the level shifter 350 shifts the input high level signal to a high level that is suitable for the upper switch driving circuit 360 so as to transmit it to the upper driver 310. At this time, the comparator 331 is enabled by the output signal of the level shifter 350. The upper driver 310 generates a normal upper gate signal NVG11 for turning on the upper switch Q1 in accordance with the output signal of the level shifter 350, and the driving current ID11 is transmitted to the gate electrode of the upper switch Q1 via the connection terminal 24 so that the gate voltage of the upper switch Q1 increases to a predetermined voltage. The increasing process is the same as that related to the first exemplary embodiment of the present invention. After increasing up to the predetermined voltage, the upper gate signal VG11 and the normal upper gate signal NVG11 are compared with each other. As a result, if the upper gate signal VG11 is less than the normal upper gate signal NVG11, a correction current IC11 that is proportional to the difference between the two signals is generated by way of the correction switch M7, and flows to the gate electrode of the upper switch Q1. Then, the upper gate signal VG11 increases such that it is not less than the normal upper gate signal NVG11. On the contrary, if the upper switch driver control signal HIN is less than the low threshold voltage, the upper switch driving circuit 360 generates and outputs a normal upper gate signal NVG11 and an upper gate signal VG11 so as to turn off the upper switch Q1. With the process of turning off the upper switch Q1, no possible errors between the two signals influence the operation of the upper switch Q1, and hence the gate signal correction circuit 330 is not operated.

The Schmidt trigger 304 outputs a high level signal or a low level signal depending upon the lower switch driver control signal LIN. When the lower switch driver control signal LIN is less than the low threshold voltage of the Schmidt trigger 204, the Schmidt trigger 204 outputs a low level signal, while when the lower switch driver control signal LIN exceeds the high threshold voltage of the Schmidt trigger 204, the Schmidt trigger 204 outputs a high level signal. The operation range of the Schmidt trigger 204 and the lower switch driving circuit 370 is determined by the Vcc voltage and the common voltage COM, and therefore, no separate level shifters are needed.

The lower switch driving circuit 370 generates a normal lower gate signal NVG21 and a lower gate signal VG21 in accordance with the lower switch driver control signal LIN. The lower switch driving circuit 370 includes a lower driver 320 and a gate signal correction circuit 340. The output signal of the Schmidt trigger 304 is input into the lower driver 320, and the lower driver 320 generates and outputs a normal lower gate signal NVG21 in accordance with the input signal. The lower driver 320 compares the normal lower gate signal NVG21 with the lower gate signal VG21, and controls the lower gate signal VG21 to be not less than the normal lower gate signal NVG21.

The gate signal correction circuit 340 compares the normal lower gate signal NVG21 with the lower gate signal VG21 in terms of voltage, and if the lower gate signal VG21 is less than the normal lower gate signal NVG21, corrects the lower gate signal VG21. The gate signal correction circuit 340 includes a comparator 341 and a correction switch M8. The comparator 341 is enabled when the output signal of the Schmidt trigger 304 has a signal level that is high enough to turn on the lower switch Q2. The inverting terminal (−) of the comparator 341 receives the normal lower gate signal NVG21, and the non-inverting terminal (+) of the comparator 341 is connected to the gate electrode of the lower switch Q2 via a connection terminal 29 so as to receive the lower gate signal VG21. If the normal lower gate signal NVG21 exceeds the lower gate signal VG21, the comparator 341 outputs a low level correction control signal VC22 that is proportional to the difference between the two signals so as to turn on the correction switch M8. The conduction degree of the correction switch M8 is controlled by the difference between the two signals, and the dimension of the correction current IC21 transmitted to the gate electrode of the lower switch Q2 is controlled through the correction switch M8. When the lower gate signal VG21 that is elevated by way of the correction current IC21 reaches the normal lower gate signal NVG21, the comparator 341 outputs a high level signal so as to turn off the correction switch M8. Then, the lower gate signal VG21 of the lower switch Q2 is not less in voltage than the normal lower gate signal NVG21. Accordingly, the lower switch Q2 can turn on in a normal manner.

Specifically, when the lower switch driver control signal LIN exceeds the high threshold voltage, the Schmidt trigger 304 outputs a high level signal, and the comparator 341 is enabled by way of the output signal. The lower driver 320 generates a normal lower gate signal NVG21 to turn on the lower switch Q2 in accordance with the output signal of the Schmidt trigger 304, and the driving current ID21 is transmitted to the gate electrode of the lower switch Q2 via the connection terminal 24 so that the gate voltage of the lower switch Q2 increases to a predetermined voltage. The increasing process is the same as that related to the first exemplary embodiment of the present invention. After being increased to the predetermined voltage, the lower gate signal VG21 and the normal lower gate signal NVG21 are compared with each other. As a result, if the lower gate signal VG21 is less than the normal lower gate signal NVG21, a correction current IC21 that is proportional to the difference between the two signals is generated by way of the correction switch M8, and flows to the gate electrode of the lower switch Q2. Then, the lower gate signal VG21 increases such that it is not less than the normal lower gate signal NVG21. On the contrary, if the lower switch driver control signal LIN is less than the low threshold voltage, the lower switch driving circuit 370 generates and outputs a normal lower gate signal NVG21 and an upper gate signal VG21 so as to turn off the lower switch Q2. With the process of turning off the lower switch Q1, no possible errors between the two signals influence the operation of the lower switch Q2, and hence the gate signal correction circuit 340 is not operated.

In this way, with the first to third exemplary embodiments of the present invention, the oscillation-induced reduction of the respective gate control signals of the upper and lower switches Q1 and Q2 is corrected by way of a correction current.

However, if the upper and lower gate control signals are overly elevated due to the oscillation, the upper and lower switches Q1 and Q2 are liable to be damaged.

With a switch driving circuit according to a fourth exemplary embodiment of the present invention, when the upper and lower gate control signals are elevated due to the oscillation, the elevation is corrected thereby.

A lower switch driving circuit according to a fourth exemplary embodiment of the present invention will now be described with reference to FIG. 5.

Figure 5:
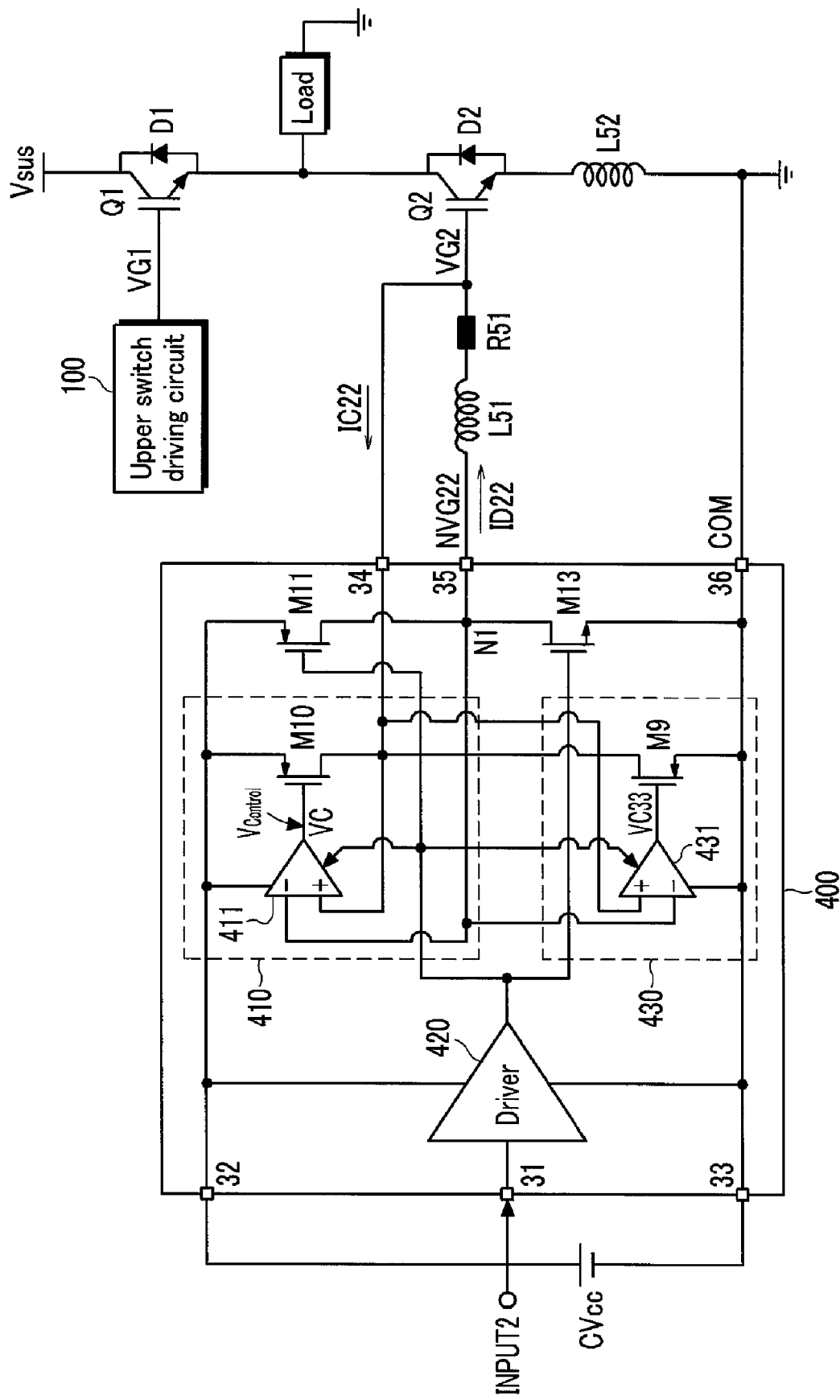
FIG. 5 illustrates a lower switch driving circuit according to a fourth exemplary embodiment of the present invention.

As shown in FIG. 5, a lower switch driving circuit 400 according to a fourth exemplary embodiment of the present invention further includes a gate signal correction circuit 430, compared with the first exemplary embodiment of the present invention. A gate signal correction circuit 410 and a driver 420 are the same as those related to the first exemplary embodiment of the present invention, and repeated description thereof will be omitted.

The gate signal correction circuit 430 includes a comparator 431 and a correction switch M9. The gate signal correction circuit 430 compares the normal lower gate signal NVG22 with the lower gate signal VG22 in terms of voltage, and if the lower gate signal VG22 exceeds the normal lower gate signal NVG22, corrects the lower gate signal VG22. The comparator 431 is enabled by way of the signal of the driver 420 for turning on the on driving switch M11. The inverting terminal (−) of the comparator 431 receives the normal lower gate signal NVG22, and the non-inverting terminal (+) of the comparator 431 is connected to the gate electrode of the lower switch Q2 via a connection terminal 34 so as to receive the lower gate signal VG22. The correction switch M9 has a drain electrode connected to the connection terminal 34, and a source electrode connected to another connection terminal 36. The conduction degree of the correction switch M9 is controlled in accordance with the output signal of the comparator 431. When the normal lower gate signal NVG22 is less than the lower gate signal VG2, the comparator 431 outputs a high level correction control signal VC33 that is proportional to the difference between the two signals so as to turn on the correction switch M9. The conduction degree of the correction switch M9 is controlled by the difference between the two signals, and a correction current IC22 is generated through the correction switch M9 from the gate electrode of the lower switch Q2 to the ground terminal connected thereto via the connection terminal 36. When the lower gate signal VG22 that is reduced by way of the correction current IC22 reaches the normal lower gate signal NVG22, the comparator 431 outputs a low level signal so as to turn off the correction switch M9. Then, the lower gate signal VG22 of the lower switch Q2 does not exceed in voltage the normal lower gate signal NVG22. Accordingly, a high gate signal is not applied to the gate electrode of the lower switch Q2 so that the lower switch Q2 can be prevented from being damaged.

The lower switch diver 400 is illustrated with the fourth exemplary embodiment of the present invention, but the present invention is not limited thereto, while making it possible to construct the switch driving circuit according to the second and third exemplary embodiments of the present invention in the same manner.

Furthermore, as the currently available upper and lower switches are formed with n-channel typed transistors, it is problematic that the upper and lower switches cannot turn on if the gate signal of the practical gate electrode is less than the normal gate signal output from the switch driving circuit. In order to solve such a problem, it is established with the first to third exemplary embodiments of the present invention that the correction current should flow to the gate electrode to increase the gate signal. On the contrary, if the gate signal exceeds the normal gate signal, the switch circuit is liable to be damaged. In such a case, the gate signal is reduced by way of the correction current.

However, the present invention is not limited thereto, but may be applicable even if the upper and lower switches are p-channel typed transistors.

Specifically, if the gate signal exceeds the normal gate signal, the upper and lower switches may not turn on, and hence the gate signal may be reduced in voltage by way of the correction current. This is similar to that related to the fourth exemplary embodiment of the present invention.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A switch driving circuit for controlling a switching operation of a switch, the switch driving circuit comprising:
   a driver configured to generate a first gate signal at an output node of the switch driving circuit for controlling the switching operation of the switch;
   a correction switch coupled to a gate electrode of the switch, the switch being coupled to receive a correction current from an output of the correction switch; and
   a comparator having inputs configured to receive the first gate signal and a second gate signal and an output coupled to the correction switch, the correction switch being coupled to receive a correction control signal from the output of the comparator, the comparator being configured to perform a comparison of the first gate signal to the second gate signal to generate the correction control signal, the output of the comparator being coupled to provide the correction control signal to the correction switch to control the correction switch to generate the correction current flowing from the correction switch to the gate electrode of the switch such that the second gate signal at the gate electrode of the switch equals the first gate signal at the output node of the switch driving circuit.

2. The switch driving circuit of claim 1, wherein the correction current flows in a direction for correcting the gate signal such that the second gate signal equals the first gate signal.

3. The switch driving circuit of claim 1, wherein the comparator is configured to generate the correction control signal proportional to a difference between the first gate signal and the second gate signal and the correction switch is configured to have a degree of conduction in accordance with the correction control signal such that the correction current flows along the correction switch.

4. The switch driving circuit of claim 1, wherein the switch is formed with an n-channel typed transistor, and if the second gate signal is less than the first gate signal, the correction current increases the second gate signal such that the second gate signal equals the first gate signal.

5. The switch driving circuit of claim 4, wherein the comparator comprises an inverting terminal receiving the first gate signal and a non-inverting terminal receiving the second gate signal, the comparator generating the correction control signal that is proportional to a difference between the second gate signal and the first gate signal if the second gate signal is less than the first gate signal and the correction switch generates the correction current in correspondence with the correction control signal.

6. The switch driving circuit of claim 1, wherein the switch is formed with an n-channel typed transistor, and if the second gate signal exceeds the first gate signal, the gate signal correction circuit generates the correction current to flow from the gate electrode of the switch such that the second gate signal equals the first gate signal.

7. The switch driving circuit of claim 6, wherein the comparator comprises an inverting terminal receiving the first gate signal and a non-inverting terminal receiving the second gate signal, the comparator generating the correction control signal that is proportional to a difference between the second gate signal and the first gate signal if the second gate signal exceeds the first gate signal and the correction switch generates the correction current in correspondence with the correction control signal.

8. A switch driving method for controlling a switching operation of a switch, the switch driving method comprising:
   generating a first gate signal at an output node to control the switching operation of the switch; and
   comparing the first gate signal with a second gate signal, the second gate signal being at the gate electrode of the switch, and
   correcting the second gate signal at the gate electrode of the switch relative to the first gate signal depending upon the comparison such that the second gate signal at the gate electrode of the switch equals the first gate signal at the output node.

9. The switch driving method of claim 8, wherein the step of correcting the second gate signal comprises:
   comparing the first gate signal with the second gate signal; and
   generating a correction current in accordance with the comparison to make the second gate signal equal the first gate signal.

10. The switch driving method of claim 9, wherein the step of comparing the first gate signal with the second gate signal comprises producing a difference between the first gate signal and the second gate signal, and the step of generating the correction current comprises generating a correction control signal in accordance with the difference, and controlling a conduction degree of the correction switch in accordance with the correction control signal.

11. The switch driving method of claim 8 wherein correcting the second gate signal at the gate electrode of the switch relative to the first gate signal comprises:
   generating a correction current in a direction that increases the second gate signal at the gate electrode of the switch to be equal to the first gate signal.

12. The switch driving method of claim 11 further comprising:
  generating a correction control signal proportional to a difference between the first gate signal and the second gate signal; and
  controlling a degree of conduction of a transistor to generate the correction current in accordance with the correction control signal.

13. A switch driving method for controlling a switching operation of a switch, the switch driving method comprising:
  a comparator receiving a first gate signal from an output node of a switch driving circuit for controlling a switching operation of a switch;
  the comparator receiving a second gate signal at a gate electrode of the switch;
  the comparator comparing the first gate signal at the output node to the second gate signal at the gate electrode of the switch to generate a correction control signal;
  a correction switch receiving the correction control signal from the comparator;
  the correction switch generating a correction current based on the correction control signal;
  the correction switch flowing the correction current to the gate electrode of the switch to increase the second gate signal such that the second gate signal at the gate electrode of the switch equals the first gate signal at the output node.

14. The method of claim 13 wherein the comparator generates the correction control signal to be proportional to the difference between the first gate signal and the second gate signal.

15. The method of claim 13 wherein the comparator generates the correction control signal to control a conduction degree of the correction switch.

* * * * *